United States Patent
Queheillalt et al.

(10) Patent No.: US 7,401,643 B2
(45) Date of Patent: Jul. 22, 2008

(54) HEAT EXCHANGE FOAM

(75) Inventors: Douglas T. Queheillalt, Charlottesville, VA (US); Haydn N. G. Wadley, Keswick, VA (US); Yasushi Katsumi, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 10/333,004

(22) PCT Filed: Jul. 16, 2001

(86) PCT No.: PCT/US01/22266

§ 371 (c)(1),
(2), (4) Date: Jan. 14, 2003

(87) PCT Pub. No.: WO02/06747

PCT Pub. Date: Jan. 24, 2002

(65) Prior Publication Data

US 2004/0123980 A1    Jul. 1, 2004

Related U.S. Application Data

(60) Provisional application No. 60/219,149, filed on Jul. 14, 2000.

(51) Int. Cl.
*F28D 15/00* (2006.01)
(52) U.S. Cl. .................................. 165/104.21; 165/907
(58) Field of Classification Search ................. 165/907, 165/133, 185, 80.3; 361/704
See application file for complete search history.

(56) References Cited

U.S. PATENT DOCUMENTS

| 1,154,254 A | 9/1915 | Lachman |
| 2,288,104 A | 6/1942 | Pasquier |
| 2,481,046 A | 9/1949 | Scurlock |
| 2,789,076 A | 4/1957 | Frieder |
| 3,298,402 A | 1/1967 | Hale |
| 3,783,969 A | 1/1974 | Pall |

(Continued)

FOREIGN PATENT DOCUMENTS

JP    01147294    6/1989

OTHER PUBLICATIONS

Wadley, "Manufacture of Cellular Metals: An Overview of Concepts for Stochastic and Periodic Materials," MetFoam 2001, (Jun. 18, 2001).

(Continued)

*Primary Examiner*—Allen J. Flanigan
(74) *Attorney, Agent, or Firm*—Robert J. Decker

(57) ABSTRACT

A method and an apparatus for the efficient transfer of heat utilizing micro heat pipes that include a cellular foam or interconnected cellular/truss network having hollow ligaments. A predetermined fraction of the internal volume of the hollow ligaments is filled with a carefully chosen working fluid, and the ends of the hollow ligaments are sealed. In operation, the working fluid evaporates in the region of high heat flux and condenses in regions of lower temperature, resulting in the transfer or redistribution of the fluid's latent heat of vaporization. For open cell foams and interconnected networks, a second fluid flowing through the open cells, separate from the working fluid but also in thermal contact with the hollow ligaments, assists in the transfer of heat from the foam and networks.

32 Claims, 8 Drawing Sheets

U.S. PATENT DOCUMENTS

| Patent No. | | Date | Inventor | Ref. |
|---|---|---|---|---|
| 3,795,288 | A | 3/1974 | Pall | |
| 3,857,217 | A | 12/1974 | Reps | |
| 3,869,778 | A | 3/1975 | Yancey | |
| 3,946,039 | A * | 3/1976 | Walz | 264/628 |
| 3,971,072 | A | 7/1976 | Armellino | |
| 3,996,082 | A | 12/1976 | Leatherman | |
| 4,001,478 | A | 1/1977 | King | |
| 4,019,540 | A | 4/1977 | Holman | |
| 4,027,476 | A * | 6/1977 | Schmidt | 60/218 |
| 4,037,751 | A | 7/1977 | Miller | |
| 4,038,440 | A | 7/1977 | King | |
| 4,067,956 | A | 1/1978 | Franklin | |
| 4,130,233 | A | 12/1978 | Chisholm | |
| 4,194,255 | A | 3/1980 | Poppe | |
| 4,223,053 | A | 9/1980 | Brogan | |
| 4,288,897 | A * | 9/1981 | Withers, Jr. | 29/890.045 |
| 4,291,732 | A | 9/1981 | Artzer | |
| 4,372,377 | A * | 2/1983 | Morris | 165/104.26 |
| 4,450,338 | A | 5/1984 | Conn | |
| 4,453,367 | A | 6/1984 | Geyer | |
| 4,461,343 | A * | 7/1984 | Token et al. | 165/104.26 |
| 4,469,077 | A | 9/1984 | Wooldridge | |
| 4,522,860 | A | 6/1985 | Scott | |
| 4,529,640 | A | 7/1985 | Brown | |
| 4,530,197 | A | 7/1985 | Rainville | |
| 4,531,511 | A | 7/1985 | Hochberg | |
| 4,569,883 | A * | 2/1986 | Renjilian | 442/194 |
| 4,625,710 | A | 12/1986 | Harada | |
| 4,632,716 | A | 12/1986 | Smith | |
| 4,639,388 | A | 1/1987 | Ainsworth | |
| 4,687,702 | A | 8/1987 | Monsees | |
| 4,703,796 | A * | 11/1987 | Meijer et al. | 165/104.26 |
| 4,756,943 | A | 7/1988 | Koletzko | |
| 4,758,299 | A | 7/1988 | Burke | |
| 4,765,396 | A | 8/1988 | Seidenberg | |
| 4,819,719 | A | 4/1989 | Grote | |
| 4,833,106 | A * | 5/1989 | Horie | 501/80 |
| 4,851,291 | A * | 7/1989 | Vigo et al. | 428/393 |
| 4,859,541 | A | 8/1989 | Maxeiner | |
| 4,883,116 | A | 11/1989 | Seidenberg | |
| 4,916,027 | A | 4/1990 | Delmundo | |
| 4,918,281 | A | 4/1990 | Blair | |
| 4,923,544 | A | 5/1990 | Weisse | |
| 4,955,135 | A | 9/1990 | Pinkhasov | |
| 4,968,367 | A | 11/1990 | Diderich | |
| 5,002,378 | A | 3/1991 | Colarusso | |
| 5,011,638 | A | 4/1991 | Pinkhasov | |
| 5,040,966 | A | 8/1991 | Weisse | |
| 5,061,660 | A * | 10/1991 | Park et al. | 501/80 |
| 5,070,673 | A | 12/1991 | Weisse | |
| 5,102,723 | A | 4/1992 | Pepin | |
| 5,110,661 | A | 5/1992 | Groves | |
| 5,137,058 | A | 8/1992 | Anahara | |
| 5,176,641 | A | 1/1993 | Idriss | |
| 5,179,043 | A | 1/1993 | Weichold | |
| 5,181,549 | A | 1/1993 | Shapovalov | |
| 5,185,297 | A * | 2/1993 | Park et al. | 501/80 |
| 5,190,539 | A | 3/1993 | Fletcher | |
| 5,217,770 | A | 6/1993 | Morris | |
| 5,219,020 | A | 6/1993 | Akachi | |
| 5,224,519 | A | 7/1993 | Farley | |
| 5,226,580 | A * | 7/1993 | Hartle et al. | 228/113 |
| 5,266,279 | A | 11/1993 | Haerle | |
| 5,282,861 | A | 2/1994 | Kaplan | |
| 5,308,669 | A | 5/1994 | Prucher | |
| 5,309,457 | A | 5/1994 | Minch | |
| 5,312,660 | A | 5/1994 | Morris | |
| 5,323,294 | A * | 6/1994 | Layton et al. | 361/699 |
| 5,349,893 | A | 9/1994 | Dunn | |
| 5,360,500 | A | 11/1994 | Evans | |
| 5,401,583 | A | 3/1995 | Stacher | |
| 5,417,686 | A | 5/1995 | Peterson | |
| 5,424,139 | A | 6/1995 | Shuler | |
| 5,431,800 | A | 7/1995 | Kirchhoff | |
| 5,455,096 | A | 10/1995 | Toni | |
| 5,465,760 | A | 11/1995 | Mohamed | |
| 5,471,905 | A | 12/1995 | Martin | |
| 5,472,769 | A | 12/1995 | Goerz | |
| 5,503,887 | A | 4/1996 | Diaz | |
| 5,511,974 | A | 4/1996 | Gordon | |
| 5,527,588 | A | 6/1996 | Camarda | |
| 5,527,590 | A | 6/1996 | Priluck | |
| 5,534,314 | A | 7/1996 | Wadley | |
| 5,547,737 | A | 8/1996 | Evans | |
| 5,591,162 | A | 1/1997 | Fletcher | |
| 5,598,632 | A | 2/1997 | Camarda | |
| 5,605,628 | A | 2/1997 | Davidson | |
| 5,624,622 | A | 4/1997 | Boyce | |
| 5,642,776 | A | 7/1997 | Meyer | |
| 5,654,518 | A | 8/1997 | Dobbs | |
| 5,656,984 | A | 8/1997 | Paradis | |
| 5,673,561 | A | 10/1997 | Moss | |
| 5,677,029 | A | 10/1997 | Prevorsek | |
| 5,679,467 | A | 10/1997 | Priluck | |
| 5,679,718 | A * | 10/1997 | Suh et al. | 521/53 |
| 5,698,282 | A | 12/1997 | De Meyer | |
| 5,741,574 | A | 4/1998 | Boyce | |
| 5,771,488 | A | 6/1998 | Honkala | |
| 5,772,821 | A | 6/1998 | Yasui | |
| 5,773,121 | A | 6/1998 | Meteer | |
| 5,808,866 | A | 9/1998 | Porter | |
| 5,817,391 | A | 10/1998 | Rock | |
| 5,885,475 | A * | 3/1999 | Salyer | 252/70 |
| 5,888,609 | A | 3/1999 | Karttunen | |
| 5,888,912 | A | 3/1999 | Piemonte | |
| 5,890,268 | A | 4/1999 | Mullen | |
| 5,924,459 | A | 7/1999 | Evans | |
| 5,943,543 | A | 8/1999 | Uchida | |
| 5,962,150 | A | 10/1999 | Priluck | |
| 5,970,843 | A | 10/1999 | Strasser | |
| 5,972,146 | A | 10/1999 | Fantino | |
| 5,972,468 | A | 10/1999 | Welch | |
| 6,003,591 | A | 12/1999 | Campbell | |
| 6,004,691 | A * | 12/1999 | Eshraghi | 429/133 |
| 6,076,324 | A | 6/2000 | Daily | |
| 6,077,370 | A | 6/2000 | Solvstev | |
| 6,080,495 | A | 6/2000 | Wright | |
| 6,082,443 | A | 7/2000 | Yamamoto | |
| 6,170,560 | B1 | 1/2001 | Daily | |
| 6,173,761 | B1 * | 1/2001 | Chandratilleke et al. | 165/104.21 |
| 6,175,495 | B1 | 1/2001 | Batchelder | |
| 6,176,964 | B1 | 1/2001 | Parente | |
| 6,183,855 | B1 * | 2/2001 | Buckley | 428/317.9 |
| 6,189,286 | B1 | 2/2001 | Seible | |
| 6,200,664 | B1 | 3/2001 | Figge | |
| 6,204,200 | B1 | 3/2001 | Shieh | |
| 6,207,256 | B1 | 3/2001 | Tashiro | |
| 6,228,744 | B1 | 5/2001 | Levine | |
| 6,284,346 | B1 | 9/2001 | Sheridan | |
| 6,383,422 | B1 * | 5/2002 | Hoffschmidt | 264/44 |
| 6,644,535 | B2 | 11/2003 | Wallach | |
| 6,676,797 | B2 | 1/2004 | Tippett | |
| 6,739,104 | B2 | 5/2004 | Tokonabe | |
| 6,740,381 | B2 | 5/2004 | Day | |
| 6,780,505 | B1 * | 8/2004 | Klett et al. | 428/367 |
| 6,855,422 | B2 * | 2/2005 | Magill et al. | 428/373 |
| 7,211,348 | B2 | 5/2007 | Wadley | |
| 2001/0001175 | A1 | 5/2001 | Narwankar | |

OTHER PUBLICATIONS

Unknown, "DUOCEL Foam Metal for Semiconductor Applications," ERG Materials and Aerospace Corporation website.

Unknown, ERG Materials and Aerospace Corporation website.

Unknown, "Reticulated Vitreous Carbon," ERG Materials and Aerospace Corporation website.

Unknown, "Properties of DUOCEL Silicon Carbide Foams," ERG Materials and Aerospace Corporation website.

Boomsma, "Metal Foams for Compact High Performance Heat Exchangers," Laboratory of Thermodynamics in Emerging Technologies.

Gibson, "Metallic Foams: Structure, Properties and Applications," ICTAM 2000, (Aug. 28, 2000).

Unknown, "Directed Vapor Deposition of Ultralightweight Metal Foams," UVA website.

Unknown, "Micro Heat Exchangers," Institut for Mikrotechnik Mainz GmbH, (Feb. 1, 1998).

Naanes, "Grant funds University heat-exchanger project," The Reveille, Louisiana State University, (Nov. 9, 1999).

Unknown, "Solid Sorption Machines with Heat Pipe Heat Exchangers for Heat Transfer Enhancement and Thermal Control," U.S. Civilian Research & Development Foundation website, Abstract #BE1-107.

Itoh, "Itoh's Micro Heat Pipe Home Page," Itoh's website.

Unknown, "A High Performance Heat Sink Using Micro Heat-Pipes Now Available at Low Price," Furukawa Electric website, (Jan. 25, 2000).

Unknown, "The Application of Micro-Heat-Pipe in a Portable Electronic System," Industrial Technology Research Institute, vol. 7 (Winter), (1996).

Unknown, "Thermal Management—Heat Pipes," Fujikura Europe Limited website, United Kingdom.

Unknown, "Thermal Management—Heat Sinks," Fujikura Europe Limited website, United Kingdom.

Queheillalt, et al., "Electron beam—directed vapor deposition of multifuntional structures," Mat. Res. Soc. Symp. Proc., vol. 672, (Nov. 12, 2001).

Seok Hwan Moon, et al., "Experimental study on the thermal performance of micro-heat pipe with cross-section of polygon," Microelectronics Reliability 44 (2004) 315-321, (Feb. 12, 2003).

L. J. Gibson, "Mechanical Behavior of Metallic Foams," Annu. Rev. Matter. Sci., p. 191-227, 2000.

Evans, "Lightweight materials and structures," MRS Bulletin Oct. 2001.

Sypeck, "Multifunctional microtruss laminates: Textile synthesis and properties," Mat. Res. Soc. Symp. Proc. vol. 672 2001 Materials Research Society.

* cited by examiner

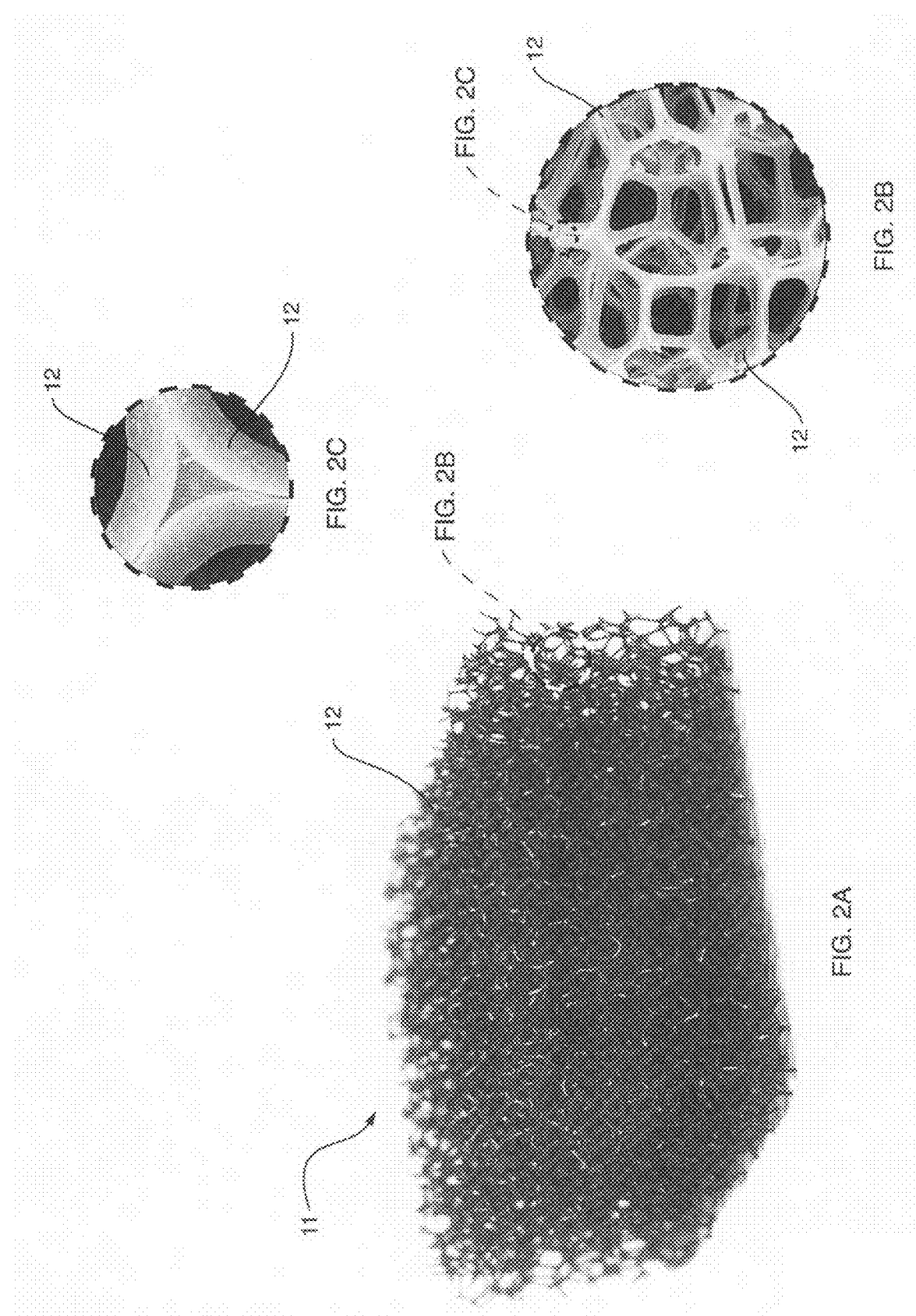

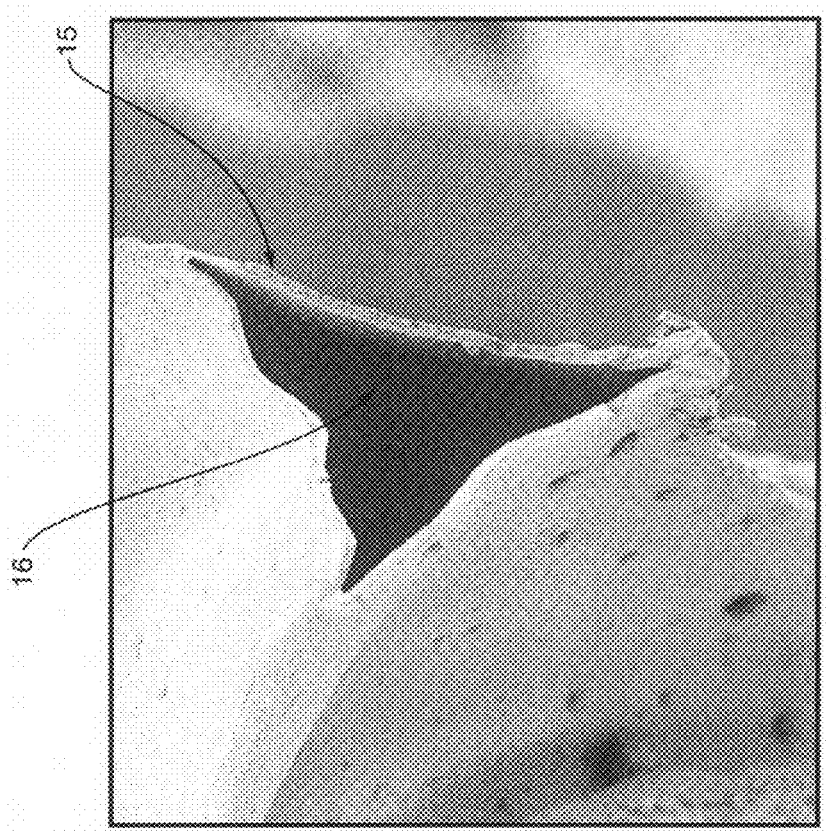
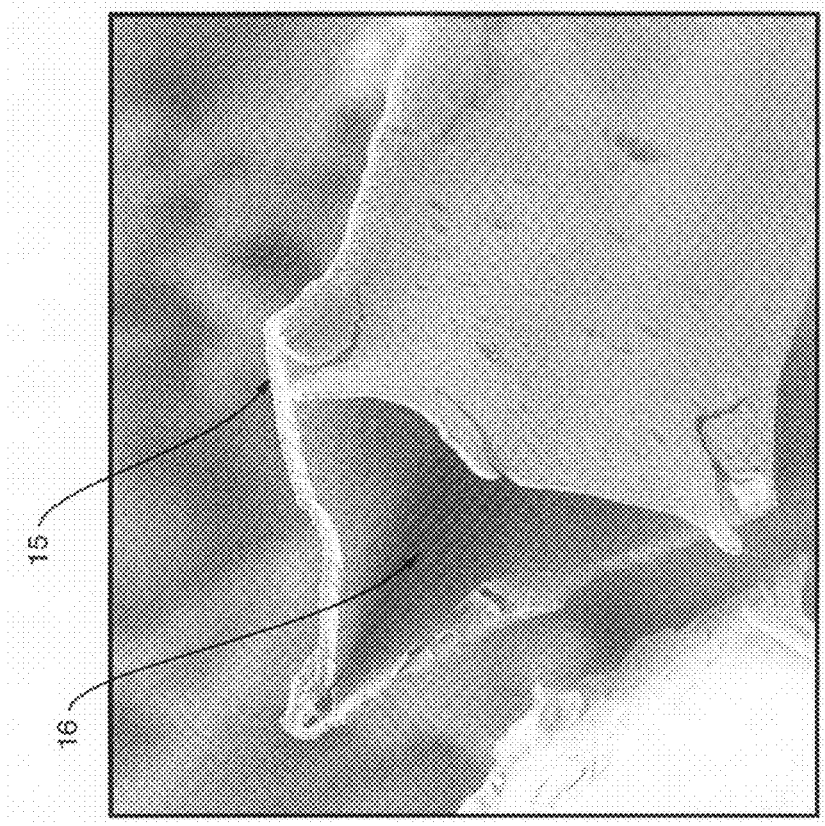
FIG. 6A
FIG. 6B

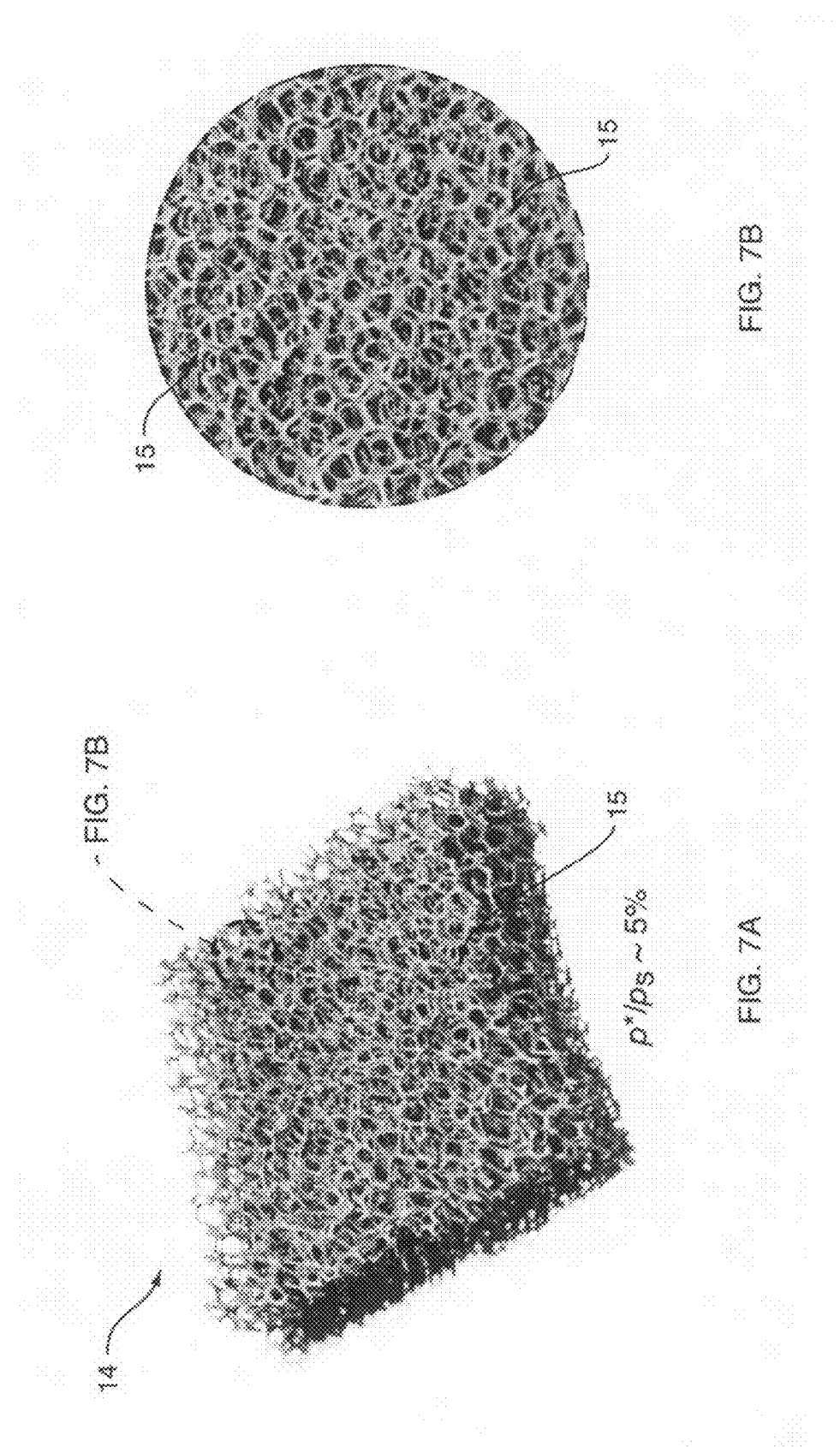

HEAT EXCHANGE FOAM

RELATED APPLICATIONS

This application is a national stage filing of International Application No. PCT/US01/22266, filed on Jul. 16, 2001, which claims benefit under 35 U.S.C. Section 119(e) from U.S. Provisional Application Ser. No. 60/219,149, filed on Jul. 14, 2000, entitled "Super Thermal Conducting Materials: Synthesis, Properties and Performance," the entire disclosures of which are hereby incorporated by reference herein.

GOVERNMENT SUPPORT

Work described herein was supported by Federal Grant Number N00014-96-I-1028, awarded by the Office of Naval Research. The United States Government possesses certain rights in and to this invention.

FIELD OF INVENTION

This invention relates to a method and apparatus for the efficient transfer of heat, and more specifically to a three-dimensional micro heat pipe utilizing a hollow ligament foam or interconnected network, and the method of manufacturing the same.

BACKGROUND OF INVENTION

Heat exchangers are widely used to facilitate the transfer of heat from regions of higher temperature to lower temperature. Metal or carbon foam structures are commonly employed in heat exchangers, wherein such structures have a relatively large surface area and are lightweight. The vast majority of foam heat exchangers is of the open cell or open pore variety, which allow the passing of fluid through the open foam. A lower temperature fluid, whether a liquid, gas or otherwise, that is made to flow through such an open cell foam heat exchanger receives heat energy from the higher temperature solid ligaments of the foam and carries away such heat. DUO-CEL, and an open cell foam manufactured by ERG of Oakland, Calif., is advertised as being useful as a heat exchanger.

However, these foam materials transport heat by conduction through solid ligaments. The thermal conductivity of the ligament material then controls the rate of heat extraction from a hot object. Because the ligaments need to be interspersed with open porosity to allow efficient heat transfer to occur to a cooling fluid, heat removal from small hot objects is problematic. The foam materials do not utilize convective heat transfer processes and can be difficult to use in small devices and other applications. So for many applications, heat pipes are the preferred method to facilitate heat transfer. A heat pipe is essentially a closed system of heat transfer in which a small amount of liquid (the "working fluid") within a sealed and evacuated enclosure is cycled through evaporation and condensation cycles. Heat entering the enclosure at one location evaporates the working fluid at such location of higher temperature (the "evaporator region"), producing vapor that moves by convection to a location of lower temperature (the "condenser region") within the enclosure, where it condenses back to the liquid state. Heat is absorbed by the working fluid during the evaporation process at the evaporator region. The evaporation of the working fluid increases the pressure in the evaporator region, and such pressure increase causes the vapor to flow to the condenser region. Heat is released from the working fluid during the condensation process at the condenser region. The amount of heat absorbed by the working fluid during evaporation, and the amount of heat released from the working fluid during condensation, depend on the type of working fluid used in the heat pipe.

In order for the heat transfer cycle to continue, the condensed working fluid must return to the evaporator region, where it will again be vaporized. Generally, wicks are used to permit this return, where capillary forces in the wicking structure drive the liquid back to the evaporator region. However, micro heat pipes, such as those described by Cotter (See Cotter, T. P., 1984, "*Principals and Prospects of Micro Heat Pipes*," Proc. 5$^{th}$ Int'n Heat Pipe Conf., Tsukuba, Japan, pp. 328-335), are wickless, relying on the wicking action of their non-circular enclosure to transfer the working fluid to the evaporator region. The cyclic evaporation and condensation processes in a micro heat pipe cause a capillary pressure difference between the evaporator and condenser regions. For micro heat pipes with non-circular (preferably, cusp-shaped or triangular) cross sections, the corner regions of the heat pipe act as return channels for the working fluid, and the capillary pressure difference promotes the flow of the working fluid from the condenser region back to the evaporator region along such channels. Thus there is no need for a wick in such micro heat pipes. For heat sources with dimensions in the sub-millimeter range and smaller, like those of a microcircuit, micro heat pipes are often employed to facilitate heat transfer.

Though useful for a number of small scale applications, one and two dimensional micro heat pipes, like those claimed in U.S. Pat. Nos. 5,179,043 to Weichold, et al., 5,598,632 to Carmarda, et al., and 5,527,588 to Carmarda, et al., which are hereby incorporated by reference in their entirety herein, are limited in the art to one dimensional and two dimensional heat transfer. They are also relatively heavy, unnecessarily rigid, and expensive to produce in full arrays. Importantly, their ability to transfer heat by conduction and radiation is limited.

It would be advantageous to provide an apparatus and a method for heat exchange that effectively maximizes the benefits of convection, conduction and radiation together, resulting in heat exchange efficiency an order of magnitude superior to the present state of the art.

Furthermore, there is a need in the art for such an efficient heat exchange method to apply to a wide range of operation temperatures.

Finally, it would be advantageous to scale up the overall size of the device, while still maintaining the benefit of micro heat pipe heat transfer, for use in systems orders of magnitude larger than those presently utilizing micro heat pipes. Each of these advantages is embodied in the present invention.

SUMMARY OF THE INVENTION

Some embodiments of the present invention provide a method for efficient heat redistribution coupled with a three-dimensional heat exchanger apparatus, and a method of making the same. The method and apparatus provides a foam or interconnected cellular and/or truss network having hollow ligaments. A predetermined fraction of the internal volume of the hollow ligaments is filled with a carefully chosen working fluid, and the ends of the hollow ligaments are sealed. In operation, the working fluid evaporates in the region of high heat flux and condenses in regions of lower temperature, resulting in the transfer or redistribution of the fluid's latent heat of vaporization.

In some embodiments of the present invention, a second fluid flowing through the interstitial volume of the foam or network's open cells, separate from the working fluid but also in thermal contact with the hollow ligaments, assists in the transfer of heat from the foam or interconnected network.

In particular, a first aspect of an embodiment of the present invention is directed towards a method of redistributing heat, comprising: providing an open cell foam having hollow ligaments; partially filling the hollow ligaments of the foam with a working fluid; evacuating the contents of the hollow ligaments except for the desired quantity of the working fluid; sealing the ends of the hollow ligaments to contain the working fluid; and placing one portion of the foam proximal to a heat source.

In one embodiment, the hollow foam is formed by a method comprising: providing a solid ligament foam; coating the solid ligament foam with a material of higher melting temperature than the solid ligament foam; and evaporating the solid ligament foam by heating the coated solid ligament foam combination to a temperature greater than vaporization temperature of the solid ligament foam, but below the melting temperature of the coating material.

Another aspect of an embodiment of the present invention is directed towards a method of manufacturing a three-dimensional heat exchanger, comprising: providing an open cell foam having hollow ligaments; partially filling the hollow ligaments of the foam with a working fluid; evacuating all contents of the hollow ligaments except for the desired quantity of the working fluid; and sealing the ends of the hollow ligaments to contain the working fluid.

A further aspect of an embodiment of the present invention is directed towards a three-dimensional heat exchanger, comprising: an open cell foam having hollow ligaments with an evacuated internal volume; a means for sealing the ends of the hollow ligaments of the foam; and a working fluid confined within the interior volume of the hollow ligaments of the foam by the sealing means.

In addition, an aspect of an embodiment of the present invention is directed towards a method of redistributing heat, comprising: providing an open cell interconnected network having hollow ligaments; disposing at least one wicking structure within a plurality of each of the hollow ligaments; partially filling the hollow ligaments of the interconnected network with a working fluid; evacuating the contents of the hollow ligaments except for the desired quantity of the working fluid; sealing the ends of the hollow ligaments to contain the working fluid; and placing one portion of the interconnected network proximal to a heat source. In one embodiment, the open cell interconnected network comprises either a truss structure or cellular structure, or combination thereof.

In addition, in one embodiment of an aspect of the present invention is directed towards a method of manufacturing a three-dimensional heat exchanger, comprising: providing an open cell interconnected network having hollow ligaments; disposing at least one wicking structure within a plurality of each of the hollow ligaments; partially filling the hollow ligaments of the interconnected network with a working fluid; evacuating all contents of the hollow ligaments except for the desired quantity of the working fluid; and sealing the ends of the hollow ligaments to contain the working fluid.

Further yet, in one embodiment of an aspect of the present invention is directed towards a three-dimensional heat exchanger, comprising: an open cell interconnected network having hollow ligaments with an evacuated internal volume; at least one wicking structure within a plurality of each of the hollow ligaments; a means for sealing the ends of the hollow ligaments of the interconnected network; and a working fluid confined within the interior volume of the hollow ligaments of the interconnected network by the sealing means.

The sizes, dimensions, proportions, and materials discussed herein are intended to be illustrative, rather than limiting.

Accordingly, an advantage of some embodiments of the present invention heat exchange apparatus and related method is that it transfers heat at an efficiency order of magnitude better than conventional conductive heat exchangers. The increased efficiency is a product of the decrease in the temperature gradient across the heat exchanger device.

A further advantage of some embodiments of the present invention heat exchange apparatus and method is that allows for the hollow ligaments of an open or closed cell foam or interconnected cellular and/or truss network to act as the walls of a micro heat pipe. The foam or network must possess hollow ligaments in order utilize heat pipe heat transfer effects.

These and other objects, along with advantages and features of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 2A is a photographic depiction of the template foam.

FIG. 2B is a micrographic depictions of a magnified partial view of the solid ligament foam shown in FIG. 2A.

FIG. 2C is a micrographic depictions of a magnified partial view of the solid ligaments shown in FIG. 2B.

FIGS. 6A-6B show a micrographic depiction of perspective sectional views of an approximately triangular shaped hollow ligament having an internal volume.

FIG. 7A shows a photographic depiction of a perspective view of an open cell hollow foam with hollow ligaments that has been formed using the DVD machine.

FIG. 7B shows a micrographic depiction of a magnified partial view of the various hollow ligaments of FIG. 7A.

FIG. 10A shows a schematic representation of another preferred embodiment of the present invention wherein an interconnected network is provided having a periodic truss structure made up of an array of intersecting structural support members whereby the structural support member form the hollow ligaments.

FIG. 10B shows an enlarged cross-sectional elevational view of select ligaments of the truss structure shown in FIG. 10A.

FIG. 10C shows an enlarged cross-sectional plan view of a select ligament of shown in FIG. 10B.

DETAILED DESCRIPTION OF THE INVENTION

The present invention heat exchanger apparatus is essentially an open cell or closed cell foam or periodic interconnected cellular/truss network with hollow ligaments, though some embodiments use open cell foams. The hollow ligaments are filled with an appropriate quantity of working fluid, typically not to exceed about 20% (but may be as great as 50%), by volume, of the internal volume of the hollow ligaments, when in liquid form. Preferably, the choice of working fluid will depend on the operating temperature of the heat exchanger, and on the material making up the cellular foam, among other variables. The present invention provides a heat pipe action resulting in a more uniform temperature distribution (that is, a smaller thermal gradient) between the portion of the heat exchanger proximal to the adjoining (or adjacent) heat source and the portion generally opposite the heat source.

A second fluid positioned within the interstitial volume of the open cells of the foam or interconnected network absorbs heat energy from the hollow ligaments, as a result of being in thermal contact with the same. Preferably, the second fluid will not be stagnant, but will be flowing through the interstitial volume of the foam or interconnected network to facilitate the transfer of heat energy from the hollow ligaments and removal of the same from the foam or interconnected network. However, even in the absence of the second interstitial fluid, (e.g., positioning the foam in a vacuum), heat transfer from the hollow ligaments will still occur at a preferentially increased rate due to radiative effects, relative to conventional art.

Figure 9B:
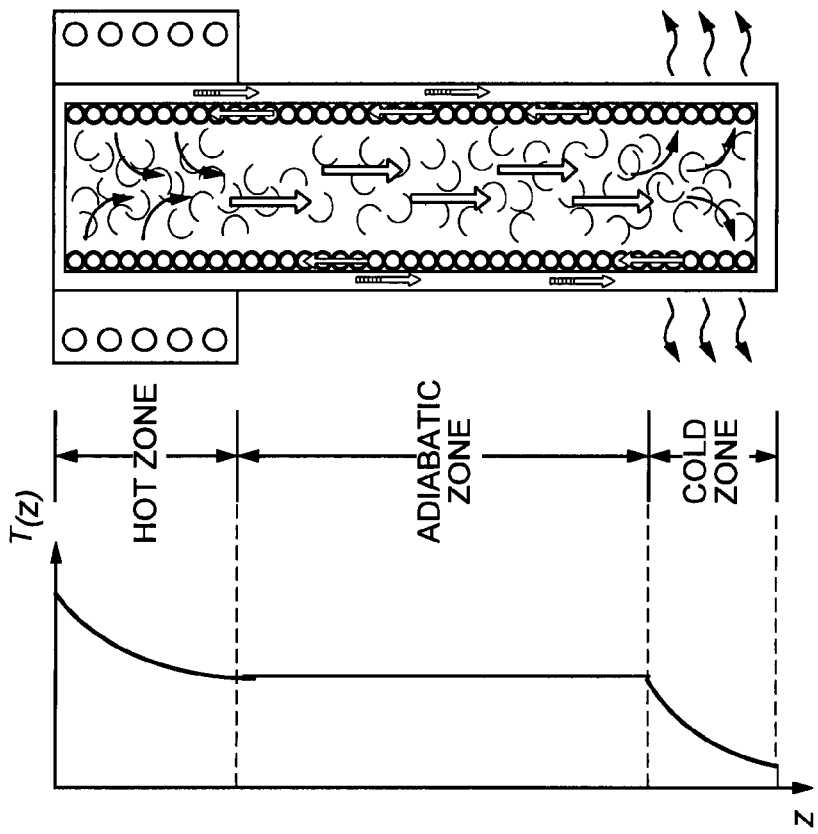
FIGS. 9A-9B are graphical representations of the heat profile diagrams of a typical solid cylinder heat exchanger and of a conventional heat pipe, respectively.

Various embodiments of the present invention provide a heat transfer efficiency an order of magnitude better than the present state of the art devices. A primary reason, among others, for the improved efficiency can be illustrated by examining FIGS. 9A and 9B, which show the heat profile diagrams of a typical solid cylinder heat exchanger and of a conventional heat pipe, respectively. These profile diagrams clearly show that heat pipes act to more uniformly distribute a constant ligament surface temperature throughout the heat pipe. Referring to FIG. 9B, in the adiabatic zone of the heat pipe temperature profile, the ligament surface temperature is nearly constant (that is, the temperature is not dependent on distance from the heat source), whereas in the solid cylinder heat exchanger, as shown in FIG. 9A, the temperature decreases roughly exponentially with distance from the heat source.

Figure 9A:
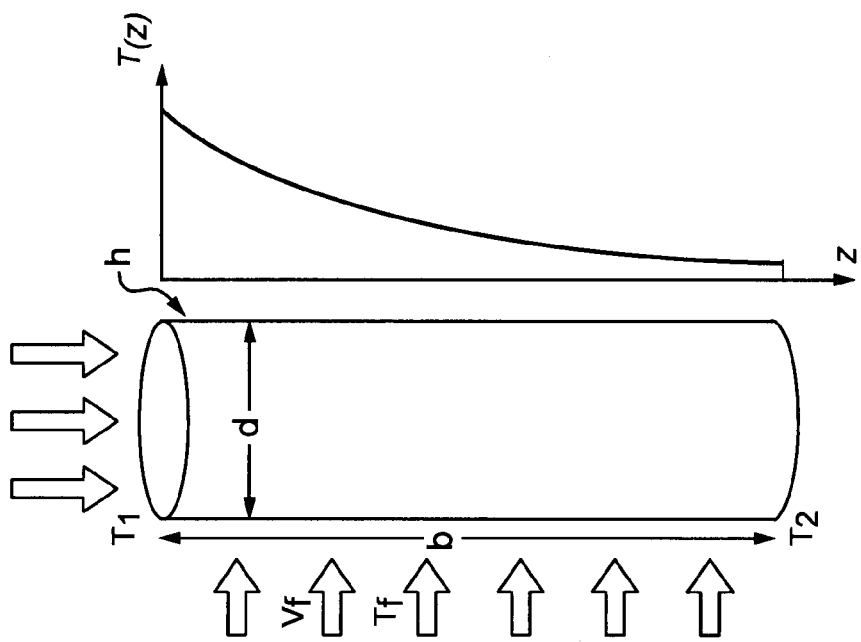

Furthermore, understanding that the same heat source Q is applied to both systems in FIGS. 9A and 9B, and that the two temperature profiles are drawn to the same scale, it is evident that the temperature is of a higher value throughout the heat pipe than it is in the solid cylinder.

Accordingly, the higher temperature along the length of the heat pipe, as shown in FIG. 9B, allows for the more efficient heat transfer in the present invention primarily for two reasons. First, the higher temperature across the hollow ligaments of the present invention acting as heat pipes results in increased radiation heat transfer over conventional solid ligament heat exchangers, for the rate of heat transfer by radiation ($H_R$) is a function of the fourth power of the absolute temperature (in Kelvin) of the ligament radiating energy, as provided by the equation $H_R \propto T^4_{(abs)}$. Therefore if the absolute temperature across a hollow ligament heat pipe is twice that of a solid cylinder heat exchanger, the heat transfer from the hollow ligament due to radiation effect will be sixteen times greater than that of the solid cylinder.

Second, the rate of heat transfer due to conduction ($H_c$) from the hollow ligament to the cooling fluid is directly dependent on the temperature difference between the two. It is presumed that the temperature is relatively constant throughout the cooling fluid, and so the higher temperature of the ligament, the greater the conductive heat transfer effects from the ligament, as provided by the equation $H_c \propto \Delta T$.

Figure 1B:
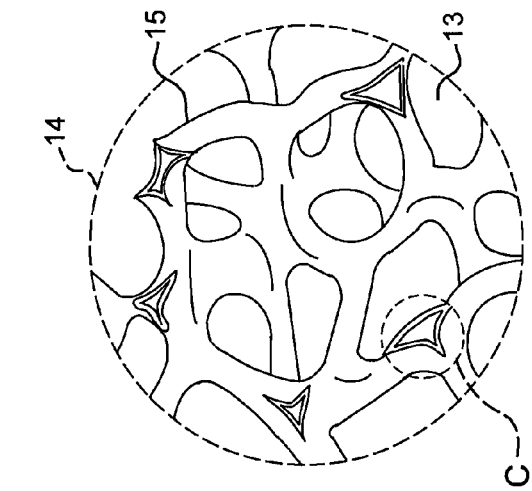
FIG. 1B shows a schematic enlarged portion of the hollow ligaments of the foam as shown in FIG. 1A.
Figure 1C:
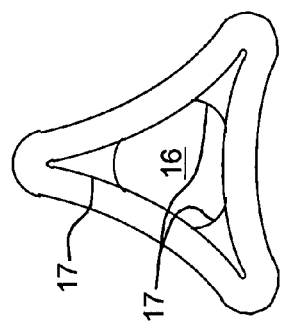
FIG. 1C shows a schematic enlarged portion of a cross-section of a hollow ligament as shown in FIG. 1B.
Figure 1A:
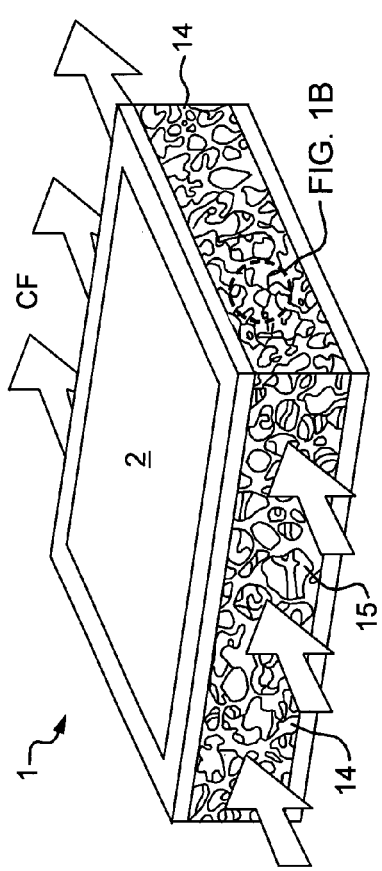
FIG. 1A shows a schematic representation of the present invention heat exchange apparatus.

Accordingly, referring to FIGS. 1A-1C, which show a schematic representation of the present invention heat exchange, a benefit of the present invention is attributed to, among other things, the hollow ligaments providing a heat pipe. Compared to solid ligaments, the hollow ligaments of the present invention remain at a higher temperature than solid ligaments and therefore are beneficial when considering the cooling fluid cross flow of FIGS. 1A-1C as denoted by arrows CF. Heat is transferred from the hollow foam ligaments 15 to the cooling fluid by means of thermal conduction. The rate of heat transfer due to conduction from the hollow ligament 15 to the cooling fluid is directly dependent on the temperature difference between the cooling fluid and the hollow ligament 15. It is presumed that the temperature is relatively constant throughout the cooling fluid, and so the higher temperature of the ligament 15, the greater the conductive heat transfer effects from the ligament.

FIGS. 2A-2C show a foam (template) 11 having solid ligaments 12 comprised of a predetermined material, for example polyurethane, polyester, polyethylene, polyamide, polyvinyl chloride, polypropylene, and polystyrene, or any sacrificial template such as water soluble salt, oxidizable graphite, an easily decomposed polymer, meltable wax or the like. FIG. 2A is a photographic depiction of the foam 11, and FIGS. 2B-2C, are micrographic depictions of a magnified partial view of the solid ligaments 12 shown in FIG. 2A. The process of creating a hollow ligament foam utilizing a solid ligament foam 11 is as follows. A method of producing a desirable hollow ligament open cell foam or periodic network structure is to coat a solid ligament open cell foam or network structure (i.e., template) with a coating material, and then evaporate away the solid ligament foam material, leaving a hollow ligament shell. In one embodiment a solid ligament foam is polyurethane foam, like that which is available from Crest Foam Industries, Inc. of Moonachie, N.J., which has cell sizes in the range of about 5 ppi to 120 ppi, possesses cusp-shaped ligaments (roughly triangular in cross sectional shape), is easy to evaporate at relatively low temperature, and is inexpensive to acquire.

A number of physical vapor deposition processes, chemical vapor deposition processes and slurry coating processes may be used to coat the solid foam (template) with an appropriate coating material which is to become the material that makes up the hollow ligament foam. However, a vast majority of these types of processes have difficulty coating a solid ligament foam uniformly if the foam body is on the order of one or a few centimeters in thickness, or of greater thickness. When producing heat exchangers of this size, it is difficult for these coating processes to penetrate the outer network of solid ligaments to uniformly coat the solid ligaments near the center of the foam body.

Figure 4:
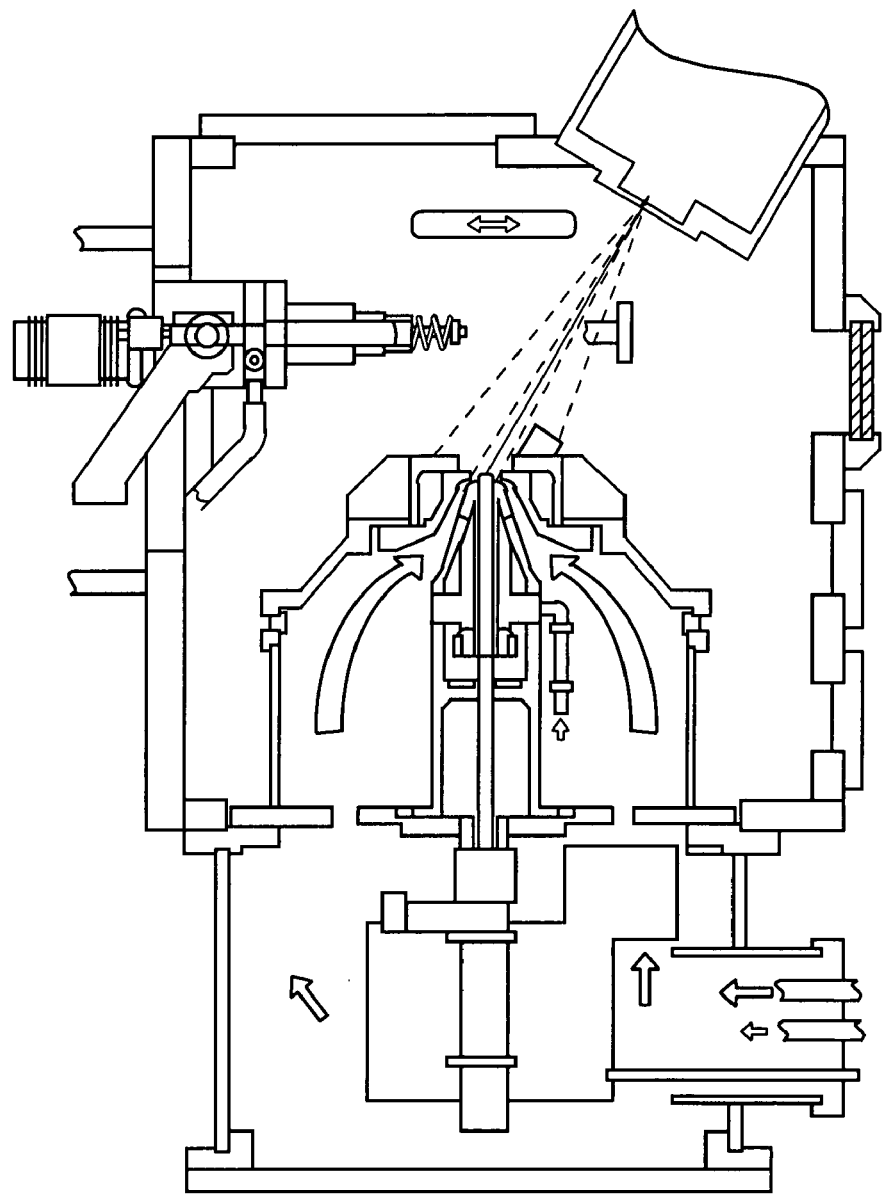
FIG. 4 is a schematic depiction of a Directed Vapor Deposition (DVD) apparatus.

One embodiment of the present invention method of coating such foams in these instances is by using a Directed Vapor Deposition (DVD) apparatus, as shown in FIG. 4, of which is taught in U.S. Pat. No. 5,534,314 to Wadley et al., and further taught in PCT Application No. PCT/US01/16693, filed May 23, 2001, by Wadley et al., both of which are hereby incorporated by reference in their entirety herein. The combination of operating pressure of the DVD system and collisions between the coating material and the DVD carrier gas stream, inter alia, result in nearly uniform coating of the solid ligaments, front and back, even those near the center of the foam body.

Moreover, other process conditions for deposition can be been identified. In fact there is some evidence that a low velocity gas jet achievable with upstream to downstream pressures close to unity may be preferred in some embodiments. Such conditions might be achievable using a different process than DVD. For example, thermal evaporation of a material in a high-pressure environment with strong pumping. This would create a flow through the foam that might entrain the vapor and lead to deposition.

The hollow ligament 15 can be made from depositing a wide variety of materials. In some embodiments, it may be preferred that the hollow ligament structure be made out of a material with relatively high thermal conductivity. In some embodiments, some preferred materials for the foam structure are metals (such as aluminum, copper or nickel), metal alloys (such as stainless steel), ceramics (such as beryllium oxide, silicon carbide and aluminum nitride), semiconductor materials, diamond, or other composite materials.

Inco Corporation of Mississauga, Ontario, Canada manufactures a hollow ligament open cell stochastic foam out of a nickel-based alloy using a chemical vapor deposition (CVD) process. However, it is believed that their manufacturing process does not provide a mechanism to manufacture foams out of other conducting metals, alloys, ceramics or semiconductors.

Returning to FIGS. 1A-1C, FIG. 1A is a schematic perspective view of a preferred embodiment the present invention heat exchange apparatus 1. The heat exchange apparatus 1 is adjoined to a heat source 2. FIG. 1B shows a schematic magnified view of the reticulated foam structure 14 showing the hollow ligaments 15 and interstitial volume 13 surrounding the same. FIG. 1C is a further magnification showing the cross sectional shape of a typical hollow ligament 15 and portion of the internal volume 16 enclosed therein with a working fluid 17.

Figure 3:
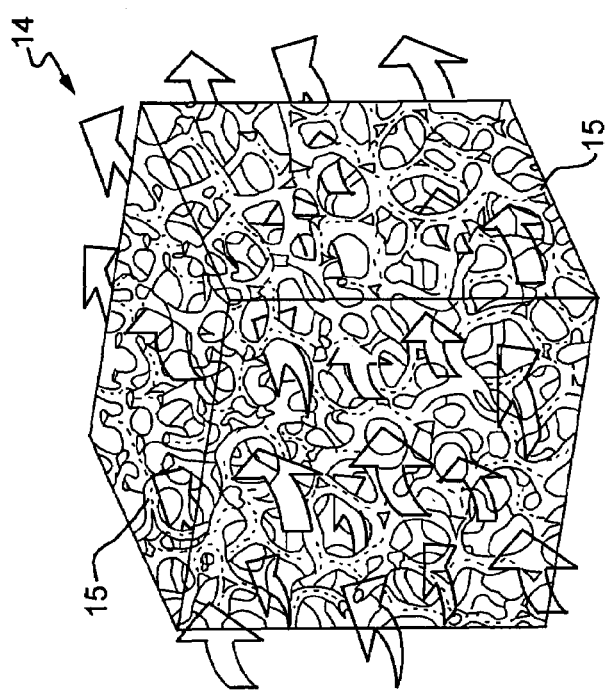
FIG. 3 shows a schematic representation of a preferred embodiment of the hollow foam comprising hollow ligaments, wherein the foam is an open cell stochastic or reticulated structure.

FIG. 3 shows a schematic representation of an alternative hollow foam 14 comprising hollow ligaments 15 wherein the foam 14 is an open cell stochastic or reticulated structure. In another embodiment, the stochastic foam will have closed pores or cells (meaning that adjacent cells are closed off from one another), which prevents an external cooling fluid from passing easily through the interstitial volume of the foam structure.

Figure 5A:
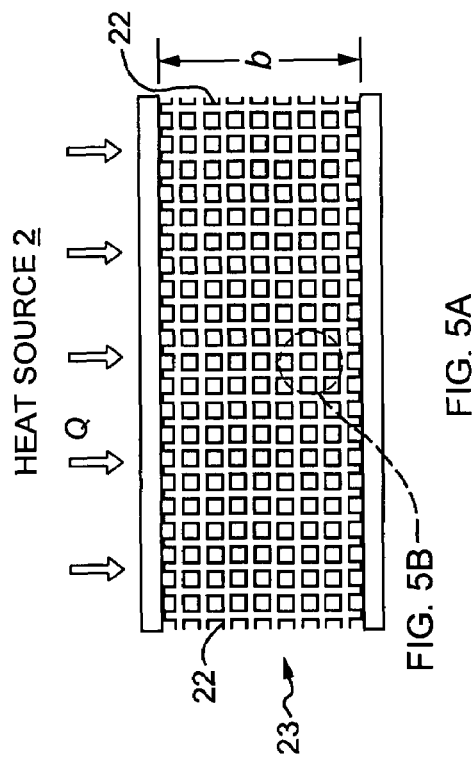
FIG. 5A shows a schematic representation of another preferred embodiment of the present invention wherein an interconnected network (two or three dimensional) is provided having a periodic cellular structure made up of an array of intersecting structural support members, whereby the structural support member form the hollow ligaments.
Figure 5B:
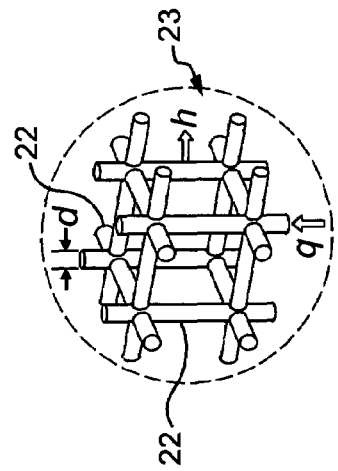
FIG. 5B shows a schematic enlarged portion of the interconnected network, wherein the network is a 3-dimensional.

FIGS. 5A-5B show a schematic representation of another preferred embodiment of the present invention wherein a interconnected network is provided having a periodic cellular structure 23 made up of an array of intersecting structural support members whereby the structural support member form the hollow ligaments 22. An example of cellular interconnected networks are further taught in PCT patent application serial number PCT/US01/17363, filed May 29, 2001, by Sypeck, et al., of which is hereby incorporated by reference in its entirety herein. In particular, Sypeck PCT/US01/17363 provides various periodic cellular structures that may be utilized for the present invention. The periodic structures are comprised of intersecting structural support members that may be used to create hollow ligaments 22 using the deposition processes described herein. The array of intersecting structural support members comprised of hollow ligaments 22 include the use of textiles, and lamination techniques, or other means of joining arranged filaments and/or textile layers, to form periodic or stochastic planar cellular structures 23.

The periodic cellular structures may be comprised of textile based cellular structures having one or more textile layers and, in some embodiments, one or more rigid (or semi-rigid) face sheets in a laminate configuration. The textile layers may be stacked upon one another to desired vertical alignment and number. The textile layer can be made of any suitable material including but not limited to woven, braided or knitted wires, filaments or tubes. A textile layer can be substantially planar, bent, curvilinear or corrugated, as well as rigid and flexible, and in a variety of arrangements (dutch-weave, hexagonal mesh, 3-dimensional weave or braid, crimped mesh, etc.). Other textile types include plane, tri-axial, multi-axial and multi-ply. All known variations of two-dimensional and three-dimensional textiles are also included. Filament types include tubular and wire filaments of constant and/or non-constant cross section.

As an additional type of interconnected network 21, periodic truss structures may be utilized as well and will be described in greater detail in Example No. 4 below. The resultant hollow ligaments that have a substantially circular (rounded) cross section will require an internal wicking structure to effect a heat pipe, as shown in FIGS. 10A-10C (discussed in greater detail below). Otherwise, an interconnected cellular or truss network that has hollow ligaments having a triangular or cusp-like shaped cross section, or an acute-angled corner will not require an internal wicking mechanism to effect a heat pipe. The corner regions of the heat pipe act as return channels or groves.

The general process of manufacturing a preferred embodiment of the present invention includes the following steps. The first step is to provide a cellular foam 14 (or interconnected—periodic or stochastic—cellular/truss structure) with hollow ligaments 15 of appropriate diameter and cross sectional shape. The second step is to partially fill the hollow ligaments 15 with an appropriate amount of working fluid 17. The third step is to evacuate the internal volume 16 of hollow ligaments 15 of all material other than the working fluid. The non-working fluid may include liquid, gas (vapor), and plasma. The fourth step is to seal off the ends of the hollow ligaments 15. It is important to appreciate that steps two, three and four need not be performed in the order provided above, and in fact it may be preferred to perform these steps, at least in part, simultaneously. For example it may be most convenient to seal off the ends of the hollow ligaments 15 on all sides of the foam 14 but one, and then to partially fill the internal volume 16 of the hollow ligaments 15 with working fluid 17, evacuate the remainder of the internal volume 16 and then seal off the end of the remaining hollow ligaments 15. Alternatively, it may be preferable to evacuate the internal volume by placing the hollow ligament foam in a vacuum chamber, and then partially fill the internal volume with working fluid while maintaining a remaining vacuum throughout such internal volume. Alternatively, a hollow structure may be reactively formed by a slurry or sol gel coating process whereby the slurry or sol gel is subsequently converted to a solid.

In some embodiments, it may be preferred to use hollow ligament foams 14 with relative density $\rho_{rel}$ (which is the ratio of actual density $\rho^*$ of the material foam to the density of the same volume of material absent any pores $\rho_s$ as provided by the equation $\rho_{rel}=\rho^*/\rho_s$) in the range of about 0.0025 to about 0.95, inclusive. In some embodiments, the preferred thickness of a hollow ligament wall is in the range of about 0.05 μm to 20 μm, and may be extended between the range of about 0.01 μm to 100 μm or much greater. In some embodiments the preferred cross section shape for the hollow ligaments of a foam would be approximately triangular, but any shape possessing corners, forming acute angles (less than 90 degrees), that promote wicking of the working fluid will suffice.

FIGS. 6A-6B show a micrographic depiction of perspective sectional views of an approximately triangular shaped hollow ligament 15 having an internal volume 16, as well as a wall thickness of a predetermined thickness. For hollow ligaments with an approximately triangular or trapezoidal cross section, the dimension of each side may be on the order of one or a few millimeters, or may be one or more orders of magnitude less. In one preferred embodiment, the dimension of each side of a hollow ligament cross section is on the order of a tenth or a few tenths of a millimeter (i.e., about 0.1 mm to about 0.50 mm). Cross sections of ligaments with smaller or larger dimensions are also possible.

For hollow ligament cross sections that are more circular or rounded in shape (i.e., lacking corners), such as for the interconnected networks, the above dimensions hold for the diameter of the circular cross sections. A wicking structure is added so as to provide for the wicking process. Cell size for open cell and closed cell foams and periodic interconnected cellular/truss networks is typically measured in the number of pores per inch (ppi) in the foam or network. In a preferred embodiment, the cell size of stochastic foams or periodic interconnected cellular/truss networks of the present invention ranges from a few ppi to several hundred ppi. The preferred range of cell size is between about 5 ppi and 120 ppi, inclusive. For example, the cell size of the open cell foam of FIG. 3 is approximately 20 ppi, and the relative density of the same is approximately 5%. The material may be copper or other desirable materials. Cell sizes for periodic cellular foams may be approximately the same, or larger as that for stochastic foams.

EXAMPLE 1

Production of Stochastic Open Cell Foam with Hollow Ligaments Using DVD

Turning to FIGS. 7A-7B, an open cell hollow foam 15 with hollow ligaments 16 that has been formed using the DVD machine and related method thereof, as shown in FIG. 4. The DVD machine allows, among other things the control of the following process variables: (1) electron beam power (measured in kilowatts (kW)), (2) carrier gas flow (measured in standard liters per minute (slm)), (3) chamber pressure (measured in Torr), (4) deposition time (measured in minutes), and (5) pressure ratio (the ratio of the nozzle pressure to the chamber pressure, a unitless number). FIG. 7A shows a photographic depiction of perspective view of the hollow foam 15 and FIG. 7B shows a micrographic depiction of a magnified partial view of the various hollow ligaments 16. The carrier gas used during the creation of such foam is helium, although a number of other non-reacting gases, like argon, and xenon are also preferred in some embodiments. In addition, reactive deposition of carbon, oxygen, and nitrogen-containing gases may be employed.

Pertaining to the method of manufacturing the present invention, first a cube-shaped reticulated polyurethane open cell foam (or cellular/truss interconnected network if desired for alternative embodiments) having solid ligaments is chosen as the material to be coated by the DVD machine. The polyurethane foam is approximately 40 mm on each end and approximately 15 mm thick, has an average pore size of about 20 ppi, and has a relative density of approximately 5%. The power of the electron beam is set to about 4.2 kW, and the Helium gas flow rate is chosen to be about 7.5 slm. The chamber pressure is set at about 0.14 Torr, and the nozzle pressure is selected to be about 0.67 Torr (thereby setting the pressure ratio at 4.79). Copper is chosen as the evaporant material and is placed in the crucible of the DVD machine as shown FIG. 4. The machine is set to run for approximately 10 to 30 minutes, and the essential operating procedures set for the in the Wadley '314 patent and/or the Wadley PCT '16693 application may be followed. Other desirable evaporant materials for deposition may be selected as well.

Upon completion of the coating process of the solid ligaments by the DVD machine, the coated solid foam combination is placed in a furnace to thermally decompose (that is, to evaporate) the polyurethane foam, leaving behind hollow copper foam. Once the coated solid foam is positioned in the furnace, the furnace chamber is evacuated via a vacuum pump, or similar means, to a vacuum pressure of approximately $1\times10^{-5}$ Torr, and the temperature in the furnace is increased at a rate of 1° Celsius per minute until the temperature reaches about 250° C. The furnace temperature is held at 250° C. for approximately two hours. Of course the rate of temperature change and maximum temperature may vary as desired. As the polyurethane material evaporates, the evaporant is evacuated from the chamber by the vacuum pump. This step results in the complete removal of the polyurethane core with minimal carbon residue on the inner surface of the hollow copper ligaments 15. FIGS. 6A-6B are exemplary illustrations of hollow ligaments 15 (comprising of copper or any predetermined material) produced via the above process. Upon examining the wall thickness of each side of the hollow ligaments 15 in FIGS. 6A-6B, it is apparent that the DVD coating method does indeed result in a substantially uniform coating of the solid polyurethane (or another desired material) foam.

The above Example No. 1 provides an estimate of the values of the essential parameters for using the DVD process to create a hollow foam. The above values are meant to be illustrative, rather than exclusive. A preferred range of values for the essential DVD process variables are as follows:

Electron beam power: from about 0.2 kW to about 15 kW, inclusive

Carrier gas flow: from about 0 slm to about 20 slm, inclusive

Chamber pressure: from about $10^{-5}$ Torr to about 10 Torr, inclusive

Pressure ratio: from about 1 to about 10, inclusive

Deposition run time: from about 5 min. to about 60 min., inclusive

Choice of carrier gas: helium, argon, xenon, or any desirable gas

Figure 8:
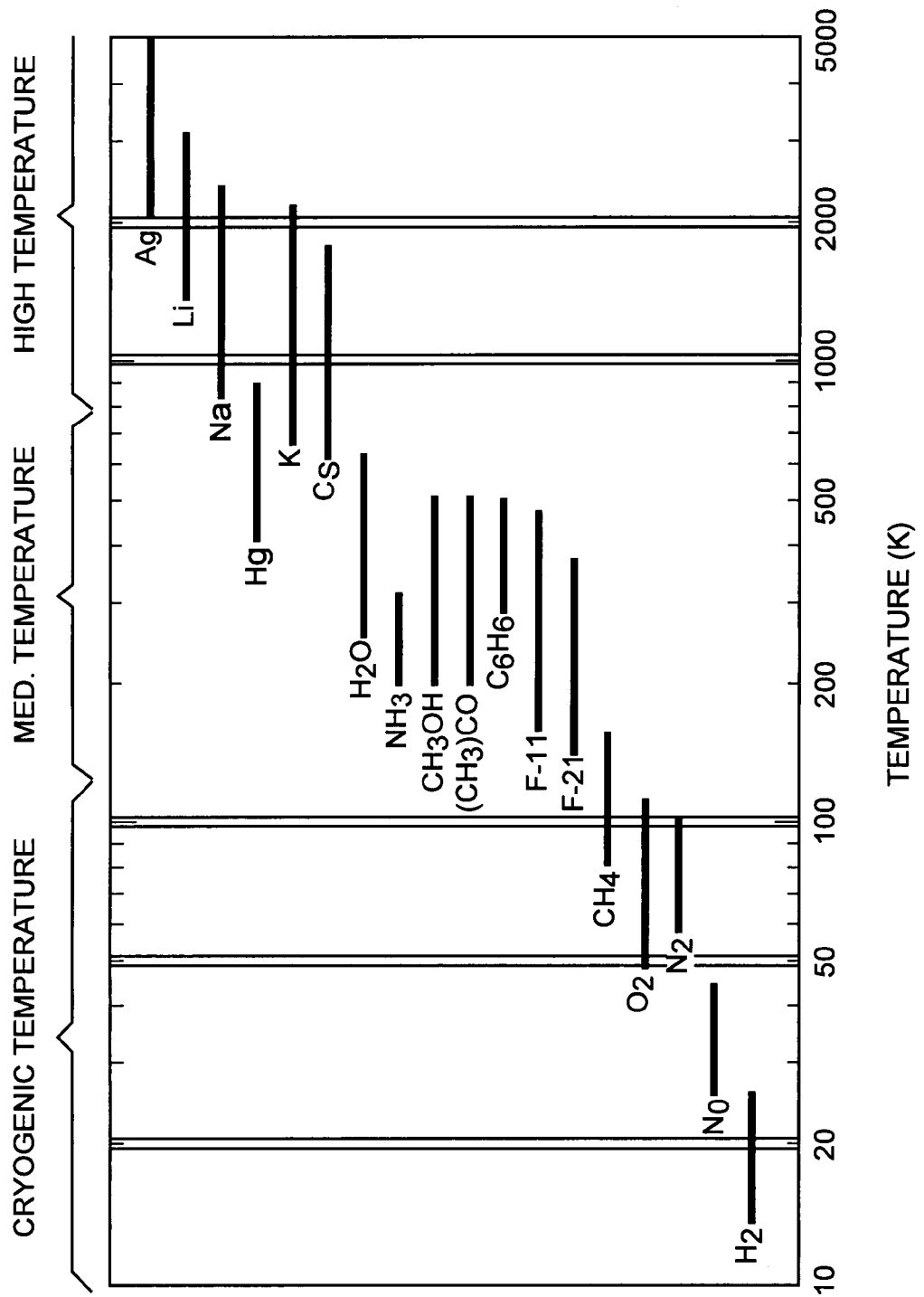
FIG. 8 is a graphical representation illustrating optimum temperature ranges for a variety of potential micro heat pipe working fluids for the present invention.

Once the hollow ligament cellular foam 14 is obtained (provided), it is necessary to partially fill the hollow ligaments 15 with an appropriate amount of a particular working fluid 17. Though a number of working fluids may be used, a list of preferred working fluids for particular operating temperatures is provided in FIG. 8. FIG. 8 is a graphical representation illustrating optimum temperature ranges for a variety of potential micro heat pipe working fluids (See G. P. Peterson, John Wiley & Sons "*An Introduction to Heat Pipes: Modeling, Testing, and Applications*," (1994).

Filling the internal volume of the hollow ligaments with working fluid can be done prior to, concurrently with, or subsequent to evacuating the internal volume of all other material.

There are a variety of methods at the disposal of a skilled artisan to evacuate the internal volume of the hollow ligaments, to fill part of the chamber with working fluid, and to seal off the ends of the hollow ligaments. Some preferred methods are provided by Example Nos. 2 and 3 below.

EXAMPLE 2

Filling the Internal Volume with Working Fluid in a Vacuum Chamber

Seal all ends of the hollow ligaments, except for those through which working fluid will be introduced into the internal volume. Place foam in a vacuum chamber and evacuate the chamber. While the chamber is still evacuated, charge the internal volume with the appropriate quantity of working fluid, possibly through the use of tubing to deliver the working fluid to the internal volume. Seal off the remaining ends of the hollow ligaments to prevent escape of the working fluid.

EXAMPLE 3

Filling the Internal Volume with Working Fluid Via Evaporation of the Fluid

Seal all ends of the hollow ligaments, except for those through which working fluid will be introduced into the internal volume. Charge the internal volume with a quantity of working fluid in excess of that amount desired to remain sealed in the internal volume, possibly by immersing the open ends of the hollow ligaments in a bath of the working fluid (working fluid will, for example, partially fill the internal volume via capillary action). Heat the working fluid to a temperature above its boiling point. The working fluid vapor will escape the internal volume and will evacuate the internal volume in the process. When the appropriate quantity of working fluid remains in the internal volume in liquid phase, seal off the remaining ends of the hollow ligaments.

By way of example, some preferred methods for sealing the ends of the hollow ligaments are (1) using an epoxy or other resin or glue to fill the end of the hollow ligament (in a preferred embodiment, the resin would have a thermal conduction coefficient similar to the material making up the heat pipe), (2) applying solder to the ends of the hollow ligaments, (3) crimping or compressing the ends of the ligaments, and (4) ionic or ultraviolet bonding process, though many other methods for sealing the ends of the hollow ligaments exist. Such sealing methods can be utilized for all of the embodiments and examples discussed herein.

EXAMPLE 4

Production of a Periodic Interconnected Truss Network with Hollow Ligaments

FIGS. 10A-10C show a schematic representation of another preferred embodiment of the present invention wherein a interconnected network is provided having a periodic truss structure 24 made up of an array of intersecting structural support members whereby the structural support member form the hollow ligaments 22. The interconnected networks include periodic truss structures 24 comprising intersecting structural support members that may be used to form the hollow ligaments 22 using the various deposition processes described above The resultant hollow ligaments 22 that have a substantially circular cross section will require an internal wicking structure 25 to effect a heat pipe, as shown in FIGS. 10B-10C (whereas ligaments with acute corners do not require the additional wicking structure). The wicking structure has two functions. It is the vehicle and mechanism through which the working fluid returns from the condenser to the evaporator and ensures that the working fluid (i.e., inside of, along side, guided by, or directed by the wicking structure 25) is evenly distributed over the entire evaporator surface. The wicking structure 25 can be of the form of wire mesh screen(s), packed spherical particles, axial groves, or sintered felt of fibers. The wicking structure 25 can be made from a polymers, metals, ceramics or the like.

The present invention periodic truss structure 24 can be shaped into cellular, truss-like architectures with open, partially closed, or mixed types of porosity and then very uniformly arranged in controlled, three-dimensional space-filling arrays. The truss-like elements do not necessarily have a constant cross-section, nor are they necessarily straight. Their cross sections can be circular, square, triangular, I-beam or other shapes of interest depending on multifunctional needs. When bonded together by solid state, liquid phase, pressing or other methods at points of contact, a cellular truss structure 24 of highly repeatable cell geometry and few imperfections results. The bonds hold the truss elements together in a desired configuration, allow load to be efficiently transferred amongst them and make the resulting structure significantly more rigid when bent, compressed or sheared. These constructed interconnected truss networks offer a broad range of multifunctional structural uses with a tremendous freedom for choosing the truss type, orientation and distribution. Multiple materials can be intermixed. This creates many opportunities for optimally designed cellular solids with multifunctional possibilities.

The present invention heat exchange apparatus and related method using hollow foams and interconnected networks provides various advantages. For instance, the hollow ligaments are capable of sustaining a higher temperature compared to a conventional solid ligament when considering the cooling fluid cross flow as heat is transferred from the foam ligaments to the cooling fluid by means of thermal conduction. The rate of heat transfer due to conduction from the hollow ligament to the cooling fluid is directly dependent on the temperature difference between the two. It is presumed that the temperature is relatively constant throughout the cooling fluid, and so the higher temperature of the ligament, the greater the conductive heat transfer effects from the ligament.

Additionally, the present invention provides the advantages associated with the convection heat transfer effects that are at work within the hollow ligaments due to the hollow ligaments functioning as micro heat pipes. The hollow ligaments of the foam (or interconnected network) are able to increase the flow of heat energy away from the heat source compared to conventional devices. This results in the ligaments having a higher temperature than they would otherwise have if they were solid ligaments. As a result heat transfer via radiation and conduction from the hollow ligaments to their surroundings occurs at a higher rate.

Moreover, the present invention hollow foam structure as a micro heat pipe provides an increased total ligament surface area. Since heat transfer by radiation and conduction are both proportional to the surface area of the heat exchanger, additional efficiency is realized.

Furthermore, the present invention heat exchanger apparatus utilizes an array of wickless (and wick installed) micro heat pipes that is lightweight, easy to construct, and provides an easily controllable method of filling the heat exchanger with working fluid.

Moreover, the present invention heat exchanger provides a structure with both exceptional thermophysical properties and mechanical properties including, but not limited thereto lightweight and higher stiffness and strength.

Finally, the present invention heat exchanger apparatus can be produced relatively inexpensively with scalability, design variation, and operating temperatures. Accordingly, the present invention apparatus and related method may be used for a host of applications including, but not limited thereto the following: thermal control devices for microelectronic of photonic systems, such as lasers, diodes, infrared detector devices, and other small electronic devices; thermal control of photovoltaic cells; removal of heat from the leading edge of hypersonic aircraft, or from the surfaces of aircrafts, surface ships, submarines, and land vehicles (e.g., to reduce the infrared signature); and the nonsurgical treatment of tumors, cancerous or burned tissue through either hyper or hypothermia; and the hot and cold branding of animals.

The invention may be embodied in other specific forms without departing from the spirit or essential characteristics thereof. The foregoing embodiments are therefore to be considered in all respects illustrative rather than limiting of the invention described herein. Scope of the invention is this indicated by the appended claims rather than by the foregoing description, and all changes which come within the meaning and range of equivalency of the claims are therefore intended to be embraced herein.

We claim:

1. A method of manufacturing a three-dimensional heat exchanger, comprising:
   providing an open cell foam having hollow ligaments;
   partially filling said hollow ligaments of said foam with a working fluid;
   evacuating all contents of said hollow ligaments except for the desired quantity of said working fluid, wherein said working fluid fills between about 0.05% and about 15% of the internal volume of said hollow ligaments of said foam; and
   sealing the ends of said hollow ligaments to contain said working fluid.

2. The method of claim 1, wherein said foam is made of a material selected from the group consisting of a metal, metallic alloy, ceramic, polymer, and composite material.

3. The method of claim 1, wherein said hollow ligaments of said foam are stochastically ordered.

4. The method of claim 1, wherein said hollow ligaments of said foam are periodically ordered.

5. The method of claim 1, wherein said working fluid is selected from the group consisting of $H_2$, $NO$, $N_2$, $O_2$, $CH_4$, F-21, F-11, $C_6H_6$, $(CH_3)CO$, $CH_3OH$, $NH_3$, $H_2O$, Hg, Cs, K, Na, Li, and Ag.

6. The method of claim 1, wherein said working fluid is made of a material having a melting point less than about 1000K.

7. The method of claim 1, wherein said working fluid is made of a material having a melting point less than about 200K.

8. The method of claim 1, wherein said working fluid fills less than about 50% of the internal volume of said hollow ligaments of said foam.

9. The method of claim 1, wherein said hollow foam is formed by a method comprising:
   providing a solid ligament foam;
   coating said solid ligament foam with a material of higher melting temperature than said solid ligament foam; and
   evaporating said solid ligament foam by heating the coated solid ligament foam combination to a temperature greater than vaporization temperature of said solid ligament foam, but below the melting temperature of said coating material.

10. The method of claim 9, wherein said solid ligament foam is a polymer.

11. The method of claim 10, wherein said polymer is made of a type selected from the group consisting of polyurethane polyethylene, polyamide, polyvinyl chloride, polypropylene, and polystyrene.

12. The method of claim 9, wherein said coating material is applied to the solid ligament foam by means of a vapor deposition process.

13. The method of claim 12, wherein said deposition process utilizes a carrier gas stream to direct the material vapor.

14. The method of claim 12, wherein said deposition process is directed vapor deposition.

15. The method of claim 9, wherein said coating material is applied to the solid ligament foam by a process selected from the group consisting of CVD, high pressure thermal evaporation, and high pressure sputtering.

16. The method of claim 9, wherein the ligaments of said solid ligament foam are stochastically or periodically ordered.

17. The method of claim 9, wherein said solid ligament foam is selected from a material selected from the group consisting of water soluble salt, oxidizable graphite, an easily decomposed polymer, and meltable wax.

18. The method of claim 1, wherein said filling occurs after said evacuating.

19. The method of claim 1, wherein said filling at least partially occurs after said evacuating.

20. The method of claim 1, wherein said filling at least partially occurs during said evacuating.

21. The method of claim 1, wherein said evacuating occurs after said filling.

22. The method of claim 1, wherein said evacuating at least partially occurs after said filling.

23. The method of claim 1, wherein said evacuating at least partially occurs during said filling.

24. A method of manufacturing a three-dimensional heat exchanger, comprising:
   providing an open cell foam having hollow ligaments;
   partially filling said hollow ligaments of said foam with a working fluid;
   evacuating all contents of said hollow ligaments except for the desired quantity of said working fluid; and
   sealing the ends of said hollow ligaments to contain said working fluid; and
   wherein said hollow foam is formed by a method comprising:
      providing a solid ligament foam;
      coating said solid ligament foam with a material of higher melting temperature than said solid ligament foam; and
      evaporating said solid ligament foam by heating the coated solid ligament foam combination to a temperature greater than vaporization temperature of said solid ligament foam, but below the melting temperature of said coating material.

25. The method of claim 24, wherein said solid ligament foam is a polymer.

26. The method of claim 25, wherein said polymer is made of a type selected from the group consisting of polyurethane polyethylene, polyamide, polyvinyl chloride, polypropylene, and polystyrene.

27. The method of claim 24, wherein said coating material is applied to the solid ligament foam by means of a vapor deposition process.

28. The method of claim 27, wherein said deposition process utilizes a carrier gas stream to direct the material vapor.

29. The method of claim 27, wherein said deposition process is directed vapor deposition.

30. The method of claim 24, wherein said coating material is applied to the solid ligament foam by a process selected from the group consisting of CVD, high pressure thermal evaporation, and high pressure sputtering.

31. The method of claim 24, wherein the ligaments of said solid ligament foam are stochastically or periodically ordered.

32. The method of claim 24, wherein said solid ligament foam is selected from a material from th group consisting of water soluble salt, oxidizable graphite, an easily decomposed polymer, and meltable wax.

* * * * *